United States Patent
Ho

(10) Patent No.: US 9,184,332 B2
(45) Date of Patent: Nov. 10, 2015

(54) INVERTED METAMORPHIC MULTI-JUNCTION (IMM) SOLAR CELL AND ASSOCIATED FABRICATION METHOD

(75) Inventor: Frank F. Ho, Yorba Linda, CA (US)

(73) Assignee: The Boeing Company, Chicago, IL (US)

( * ) Notice: Subject to any disclaimer, the term of this patent is extended or adjusted under 35 U.S.C. 154(b) by 1043 days.

(21) Appl. No.: 13/176,325

(22) Filed: Jul. 5, 2011

(65) Prior Publication Data

US 2013/0008493 A1     Jan. 10, 2013

(51) Int. Cl.
| | |
|---|---|
| H01L 31/04 | (2014.01) |
| H01L 31/0304 | (2006.01) |
| H01L 31/0203 | (2014.01) |
| H01L 31/0264 | (2006.01) |
| H01L 31/18 | (2006.01) |
| H01L 31/0687 | (2012.01) |
| H01L 31/043 | (2014.01) |

(52) U.S. Cl.
CPC .......... *H01L 31/1852* (2013.01); *H01L 31/043* (2014.12); *H01L 31/06875* (2013.01); *H01L 31/1892* (2013.01); *Y02E 10/544* (2013.01)

(58) Field of Classification Search
CPC ............................................... H01L 31/06875
USPC ......................................................... 438/87
See application file for complete search history.

(56) References Cited

U.S. PATENT DOCUMENTS

2006/0021565 A1    2/2006  Zahler et al.
2009/0272430 A1 *  11/2009 Cornfeld et al. ............. 136/255

FOREIGN PATENT DOCUMENTS

EP    1109230 A2    6/2001

OTHER PUBLICATIONS

Beaumont, B., et al.; "*Mechanically Stacked Two-Tandem Concentrator Solar Cell Concept*;" dated May 21, 1990; pp. 47-52.
Cruz-Campa, J. L., et al.; "*Fabrication of Lattice Mismatched Multijunction Photovoltaic Cells Using 3D Integration Concepts*;" Photovoltaic Specialists Conference (PVSC), 38th IEEE; dated Jun. 5, 2012; pp. 932-936.
International Search Report and Written Opinion for Application No. PCT/US2012/040917; dated Mar. 26, 2013.
"*Upside-Down Solar Cell Achieve Records Efficiencies*;" NREL's Innovative—and Inverted—Design; Innovation; dated Dec. 2010; retrieved on Jun. 14, 2011 from <http://energy.wesrch.com/page-summary-pdf-TR1L02SHJHARR-upside-down-solar-cell-achieves-record-efficiencies-2>.

(Continued)

*Primary Examiner* — Robert Carpenter
(74) *Attorney, Agent, or Firm* — Alston & Bird LLP

(57) ABSTRACT

An IMM solar cell and an associated method of fabricating an IMM solar cell are provided. In the context of a method, a first subcell may be formed upon a temporary substrate and a second subcell may be formed upon the first subcell. The second subcell may have a smaller band gap than the first subcell. The method may also bond the first and second subcells to a silicon subcell and then remove the temporary substrate. In the context of an IMM solar cell, the IMM solar cell includes first and second subcells with the first subcell disposed upon the second subcell and the second subcell having a smaller band gap than the first subcell. The IMM solar cell may also include a silicon subcell supporting the first and second subcells thereupon with a metal-to-metal bond between the silicon subcell and the second subcell.

20 Claims, 4 Drawing Sheets

(56) References Cited

OTHER PUBLICATIONS

Yang, J., et al.; *"Silicon-Based Multi-Junction Solar Cell with 19.7% Efficiency at 1-Sun Using Areal Current Matching for 2-Terminal Operation;"* Photovoltaic Specialists Conference (PVSC), 37$^{th}$ IEEE; dated Jun. 19, 2011; pp. 1019-1024.

Written Opinion for Singapore Application No. 2013088570 dated Aug. 14, 2015.

* cited by examiner

INVERTED METAMORPHIC MULTI-JUNCTION (IMM) SOLAR CELL AND ASSOCIATED FABRICATION METHOD

FEDERALLY SPONSORED RESEARCH OR DEVELOPMENT

This invention was made with Government support under Air Force Contract Number FA9453-10-C-0206 awarded by the Department of Defense. The United States Government has certain rights in the invention.

TECHNOLOGICAL FIELD

Embodiments of the present disclosure relate generally to inverted metamorphic multi junction (IMM) solar cells and associated methods for fabricating IMM solar cells and, more particularly, to IMM solar cells having a silicon subcell and associated fabrication methods.

BACKGROUND

With the emphasis on the development of alternative forms of energy, solar cells that capture solar energy and convert the solar energy into electrical energy are in demand with increased emphasis being placed on the efficiency and cost effectiveness of the solar cells. One type of solar cell that offers a number of advantages, including conversion efficiency, is an IMM solar cell. An IMM solar cell includes a plurality of subcells having band gaps that are selected to efficiently capture the solar energy. In order to appropriately tailor the band gaps, however, the subcells may be formed of materials that are lattice mismatched and/or that are coefficient of thermal expansion (CTE) mismatched. In an effort to reduce the negative impact of the lattice and/or CTE mismatch and as their name suggests, IMM solar cells are fabricated, not from the bottom up as in a conventional semiconductor fabrication process, but by growing the uppermost subcell initially followed by the intermediate subcell and finally the lowermost subcell. By fabricating an IMM solar cell in this sequence, the deleterious effects of the lattice and CTE mismatch may be concentrated within the lowermost subcell so as to have less impact upon the performance of the IMM solar cell.

One type of IMM solar cell includes a lowermost subcell formed of indium gallium arsenide (InGaAs). By tailoring the percentage of indium included within the InGaAs subcell, the band gap of the InGaAs subcell may be reduced to approximately the optimal energy band gap for solar energy collection of about 1.0 eV. However, formation of the lowermost subcell from InGaAs may create a lattice and CTE mismatch relative to the other subcells, thereby limiting the performance of the resulting IMM solar cell.

IMM solar cells are generally relatively thin and may, for example, include subcells having a collective thickness of about 10 microns. In order to permit the IMM solar cells to be fabricated and otherwise handled without an excessive amount of breakage, the IMM solar cells may be mounted upon a carrier. For example, the carrier may be formed of germanium (Ge), glass, ceramic or other material that is bonded to the IMM solar cell with an adhesive, such as an room temperature vulcanizing (RTV) adhesive. While a carrier facilitates the handling of an IMM solar cell, the carrier increases the cost of the IMM solar cell structure, that is, the IMM solar cell in combination with the mechanical carrier. Additionally, the carrier is typically disadvantageously thermally mismatched relative to the IMM solar cell.

As such, it would be desirable to design an improved IMM solar cell. In particular, it would be desirable to provide an IMM solar cell containing subcells with performance that is less limited by lattice and/or CTE mismatching.

SUMMARY

An IMM solar cell and an associated method of fabricating an IMM solar cell are provided so as to reduce, if not eliminate, the deleterious effects of lattice mismatching and/or CTE mismatching between the various subcells. In this regard, an IMM solar cell in accordance with one embodiment may reduce the CTE mismatch between the uppermost subcell and the lowermost subcell. Additionally, an IMM solar cell of one embodiment may eliminate the growth of subcells upon a lattice mismatched lowermost subcell, thereby reducing or eliminating the deleterious effects of any lattice mismatch. Additionally, an IMM solar cell of one embodiment may be structured so as to reduce breakage during handling of the IMM solar cell without requiring a carrier separate from and in addition to the subcells of the IMM solar cell.

In one embodiment, the method of fabricating an IMM solar cell is provided that forms a first subcell upon a temporary substrate and forms a second subcell upon the first subcell. The second subcell has a smaller band gap than the first subcell. The method of this embodiment also bonds the second subcell to a silicon subcell and then removes the temporary substrate. The silicon subcell of one embodiment may be formed so as to have a larger area than the first and second subcells. As such, the peripheral portion of the silicon subcell of this embodiment extends beyond the first and second subcells. In one embodiment, the first and second subcells may be formed so as to have a respective n/p junction. An n\p junction may also be formed within the silicon subcell prior to bonding the second subcell to the silicon subcell.

The method of one embodiment may also include forming a first gridded metal layer on the second subcell and forming a second gridded metal layer on the silicon subcell. In this embodiment, the second subcell may be bonded to the silicon subcell by establishing metal-to-metal bonds between the first and second gridded metal layers of the second subcell and the silicon subcell, respectively. In addition to forming the first and second gridded metal layers on the second subcell and the silicon subcell, respectively, the method of this embodiment may deposit an anti-reflection coating on exposed portions of the second subcell and the silicon subcell between grids of the first and second gridded metal layers, respectively. An electrical contact may also be formed on the first subcell following removal of the temporary substrate. In one embodiment, an anti-reflection coating may be deposited on exposed portions of the first subcell.

In another embodiment, a method of fabricating an IMM solar cell is provided that includes forming a first subcell comprised of gallium indium phosphide (GaInP) and forming a second subcell of $In_xGa_{1-x}As$ upon the first subcell with $0 \leq x \leq 0.1$. The second subcell has a smaller band gap than the first subcell. In this embodiment, the first gridded metal layer is formed on the back of the second subcell. Additionally, a silicon subcell having a second gridded metal layer thereon is provided. The method of this embodiment also establishes metal-to-metal bonds between the first and second gridded metal layers of the second subcell and the silicon subcell, respectively. The silicon subcell may have a larger area than the first and second subcell such that a peripheral portion of the silicon subcell extends beyond the first and second subcells. In one embodiment, the first and second subcells may be formed with respective n/p junctions and the silicon substrate may also be formed with an n/p junction prior to establishment of the metal-to-metal bonds.

The first subcell may be formed, in one embodiment, upon a temporary substrate of gallium arsenide (GaAs) or germanium (Ge). As such, the method may also include the removal of the temporary substrate following the establishment of the metal-to-metal bonds. The method of one embodiment may also deposit an anti-reflection coating on exposed portions of the second subcell between grids of the first metal gridded layer. In regards to providing the silicon substrate, the method may include forming the second gridded metal layer and depositing an anti-reflection coating on exposed portions of the silicon subcell between grids of the second gridded metal layer. In one embodiment, the method also includes forming an electrical contact on the first subcell following establishment of the metal-to-metal bonds. The method of this embodiment may also include depositing an anti-reflection coating on exposed portions of the first subcell.

In a further embodiment, an IMM solar cell is provided that includes first and second subcells. The second subcell has a smaller band gap than the first subcell. The IMM solar cell of this embodiment also includes a silicon subcell supporting the first and second subcells thereupon. The IMM solar cell of this embodiment also includes a metal-to-metal bond between the silicon subcell and the second subcell.

The metal-to-metal bond of one embodiment includes a first gridded metal layer on the second subcell and a second gridded metal layer on the silicon subcell. The silicon subcell of one embodiment has a larger area than the first and second subcells such that a peripheral portion of the silicon subcell extends beyond the first and second subcells. In one embodiment, the first subcell is provided of GaInP and the second subcell is comprised of $In_xGa_{1-x}As$ with $0 \leq x \leq 0.1$. In this embodiment, each of the first subcell, second subcell and the silicon subcell may have a respective n/p junction.

In accordance with embodiments of the present disclosure, an IMM solar cell and associated fabrication methods are provided in order to reduce performance limitations that may otherwise be imposed due to CTE and/or lattice mismatch while continuing to protect against breakage during the fabrication process. However, the features, functions and advantages that have been discussed may be achieved independently and the various embodiments of the present disclosure may be combined in other embodiments, further details of which may be seen with reference to the detailed description and drawings.

BRIEF DESCRIPTION OF THE DRAWINGS

Figure 1:
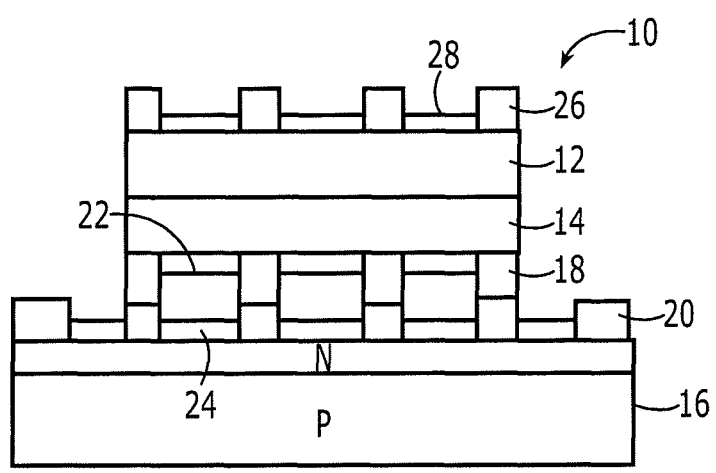
Figure 2A:
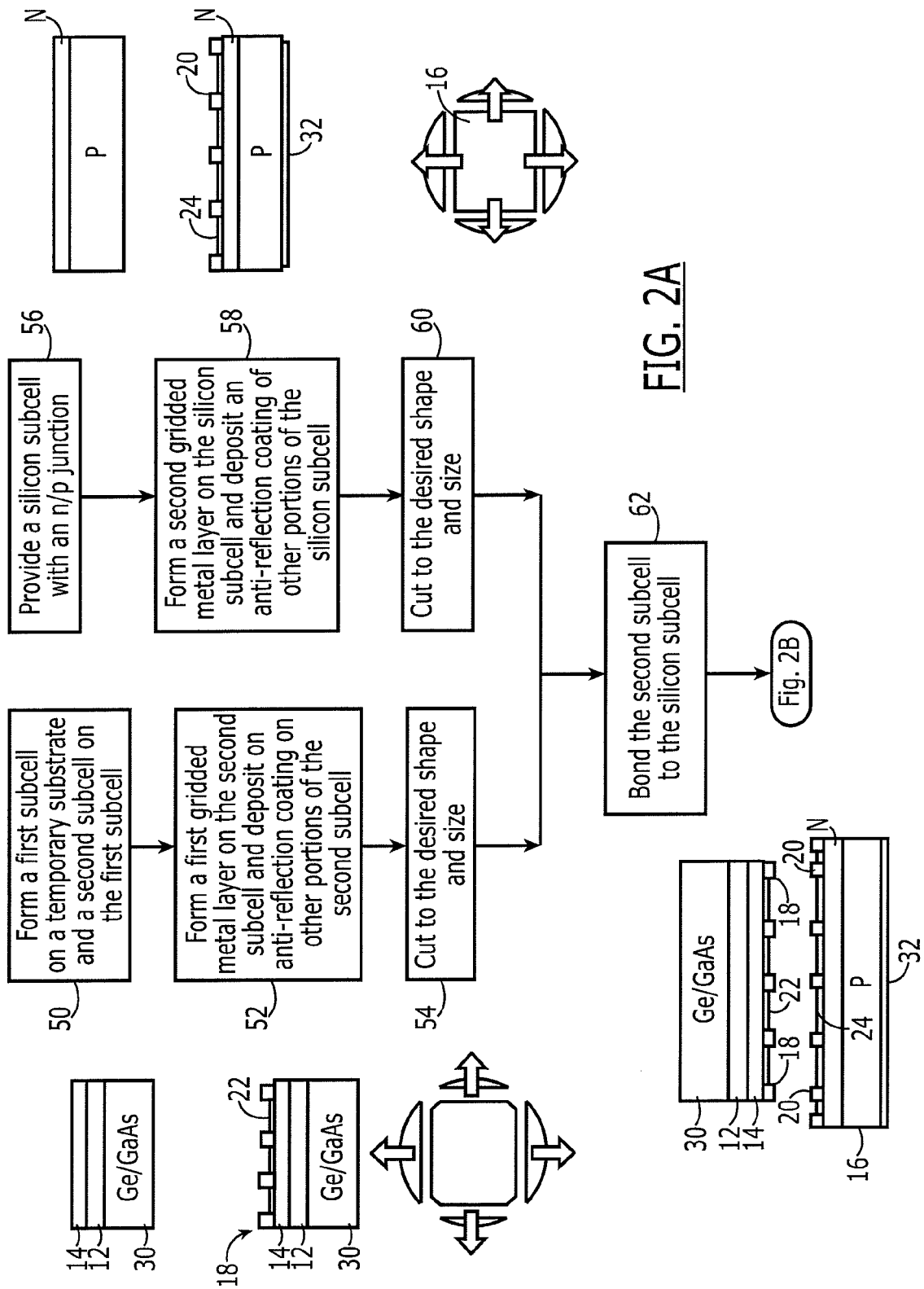
Figure 2B:
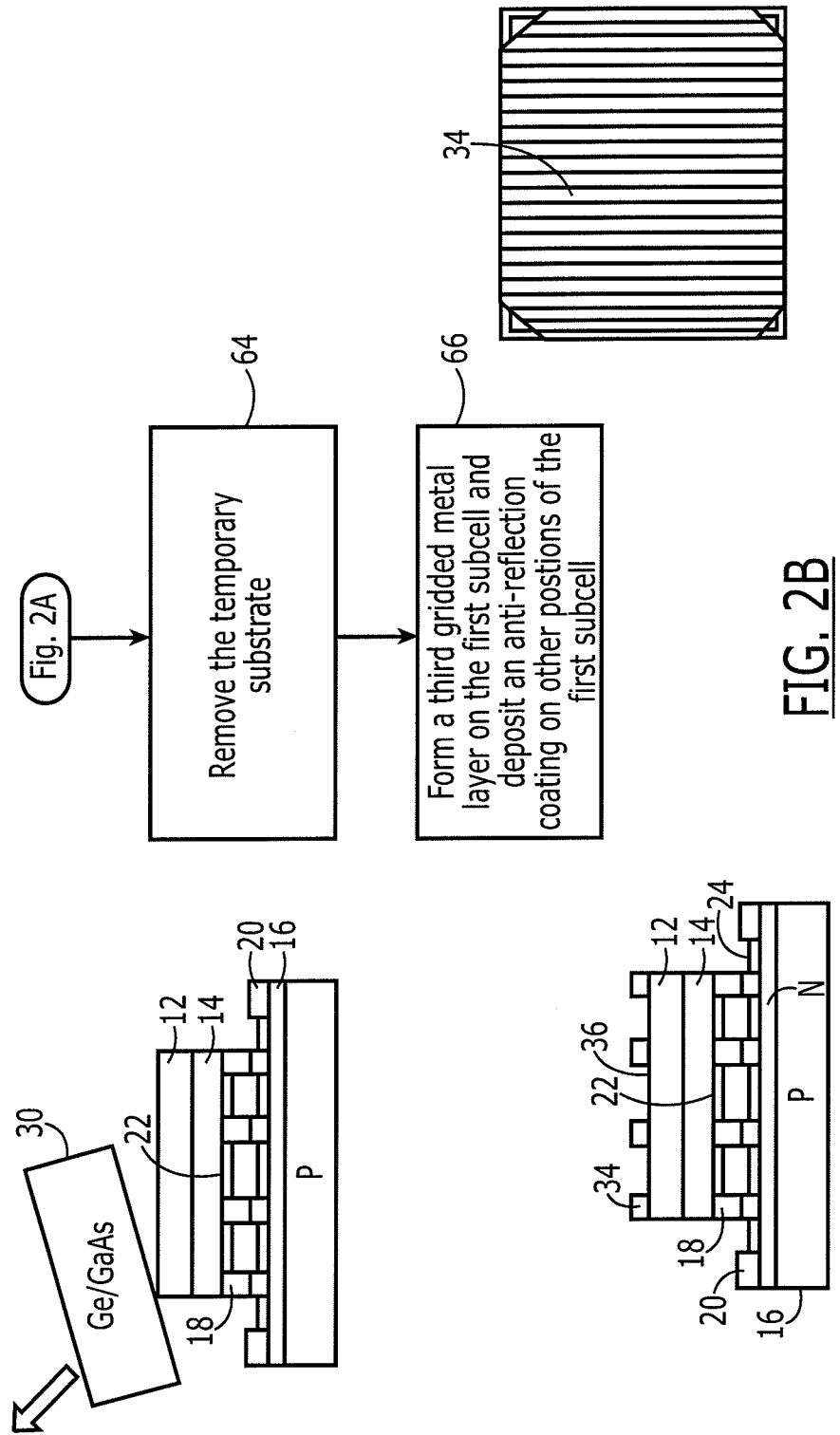
Figure 3:
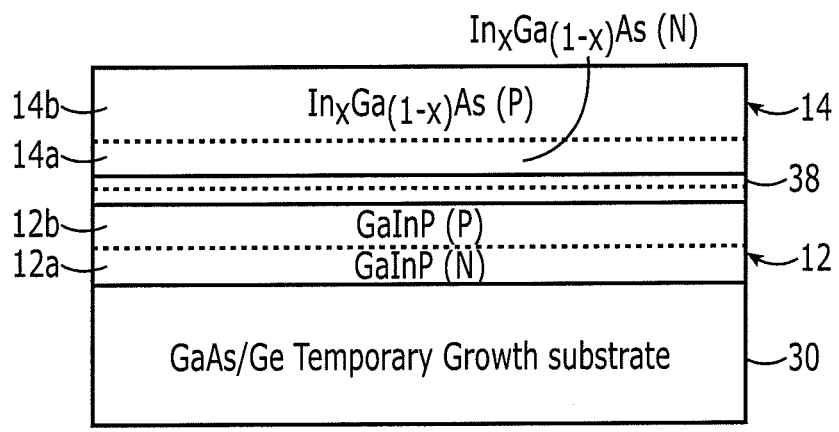
Figure 4:
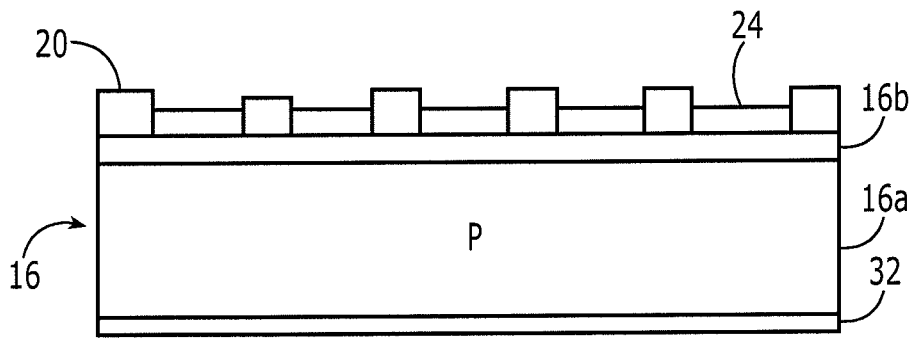
Figure 5:
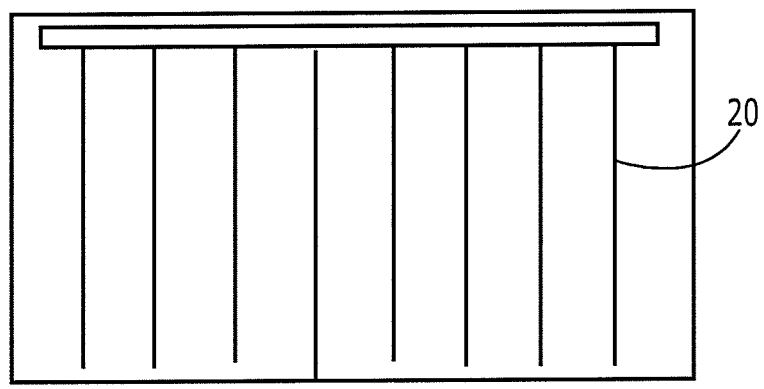

Having thus described embodiments of the present disclosure in general terms, reference will now be made to the accompanying drawings, which are not necessarily drawn to scale, and wherein:

FIG. 1 is a plan view of an IMM solar cell in accordance with one embodiment of the present disclosure;

FIGS. 2a and 2b are flowcharts illustrating operations performed in accordance with an embodiment of the present disclosure;

FIG. 3 is a plan view of the first and second subcells carried by a temporary substrate in accordance with one embodiment of the present disclosure;

FIG. 4 is a plan view of a silicon subcell in accordance with one embodiment of the present disclosure; and FIG. 5 is a top view of the silicon subcell of FIG. 4.

DETAILED DESCRIPTION

Embodiments of the present disclosure now will be described more fully hereinafter with reference to the accompanying drawings, in which some, but not all embodiments are shown. Indeed, these embodiments may be embodied in many different forms and should not be construed as limited to the embodiments set forth herein; rather, these embodiments are provided so that this disclosure will satisfy applicable legal requirements. Like numbers refer to like elements throughout.

Referring now to FIG. 1, an IMM solar cell 10 in accordance with one embodiment of the present disclosure is depicted. The IMM solar cell 10 includes a plurality of subcells, such as a first subcell 12, a second subcell 14 and a third subcell 16. Once fabricated, the first subcell 12 may be the uppermost subcell, the second subcell 14 may be the intermediate subcell and the third subcell 16 may be the lowermost subcell. As shown in FIG. 1, the first and second subcells 12, 14 may be spaced apart from the third subcell 16 so as to reduce issues relating to CTE and lattice mismatch between the first and second subcells and the third subcell, as described below. However, the first and second subcells 12, 14 and the third subcell 16 are electrically connected, such as by means of a metal-to-metal bond that serve both to electrically connect and to physically space the first and second subcells from the third subcell. As described below, the third subcell 16 may be formed of silicon (Si) so as to not only function as the third subcell, but also to serve as a carrier so as to protect against breakage of the IMM solar cell 10 during fabrication and handling.

As shown in FIG. 2a, the combination of the first and second subcells 12, 14 is generally fabricated independent of and, in some embodiments, in parallel with the fabrication of the third subcell 16. In regards to the fabrication of the first and second subcells 12, 14, the first subcell may be formed on a temporary substrate 30. See operation 50 as well as the associated plan view. As used herein, a layer may be considered on another layer if the layers are disposed in a supporting, overlying or underlying relationship regardless of whether the layers are in direct physical contact and regardless of whether the layers are separated by one or more intervening layers. The first subcell 12 may be formed in various manners, but the first subcell is epitaxially grown upon the temporary substrate 30 in one embodiment. The first subcell 12 and the temporary substrate 30 may be formed of various materials. In one embodiment, however, the first subcell is formed of GaInP and the temporary substrate is formed of GaAs or Ge, as shown in FIG. 3. As also shown in FIG. 3, an n/p junction may be formed within the first subcell 12 as the first subcell 12 contains a layer of n-type material and an adjacent layer of p-type material so as to thereby define a p-n junction. As such, an n-region 12a of the first subcell 12 may be proximate the temporary substrate 30, while a p-region 12b of the first subcell may be spaced apart from and face away from the temporary substrate.

As also shown in operation 50 and the associated plan view, a second subcell 14 may then be formed on the first subcell 12, such as by epitaxial deposition. The second subcell 14 is generally formed of a different material than the first subcell 12 and, in the embodiment of FIG. 3, is formed in $In_xGa_{1-x}As$ with $0 \leq x \leq 0.1$. As with the first subcell 12, an n/p junction may be formed within the second subcell 14 as the second subcell 14 contains a layer of n-type material and an adjacent layer of p-type material so as to thereby define a p-n junction. As shown in FIG. 3, an n-region 14a of the second subcell 14 may therefore be proximate the first subcell 12 and, in particular, the p-region 12b of the first subcell, while the p-region 14b of the second subcell is spaced apart from and faces away from the first subcell. As a result of the proximate relationship of the n-region 14a of the second subcell 14 and the p-region 12b of the first subcell 12, a tunnel junction 38 may be formed in some, but not all embodiments between the first and second subcells in which both the n-region 14a of the second subcell 14 and the p-region 12b of the first subcell 12 are heavily doped. In an embodiment that includes a tunnel junction 38, the tunnel junction may include an n+-region proximate the second subcell and a p+-region proximate the first subcell.

As shown in operation 52 and the associated plan view of FIG. 2a, a gridded metal layer 18 may then be formed upon the second subcell 14, such as upon the p-region 14b of the second subcell. While gridded metal layers may be formed in various configurations, the gridded metal layer 18 of one embodiment includes a plurality of grids extending in generally parallel manner across the surface of the second subcell 14 and a common electrode connecting each of the grids and generally positioned proximate one edge of the second subcell. The gridded metal layer 18 may be formed by various techniques, such as by thermal vapor deposition. In the illustrated embodiment, an anti-reflection coating 22 may also be formed, such as by thermal vapor deposition, on the exposed portions of the second subcell 14, such as upon the exposed portions of the p-region 14b of the second subcell between the grids of the gridded metal layer 18. The anti-reflection coating 22 may be formed of various materials, but is formed of titanium oxide ($TiO_x$), aluminum oxide ($Al_2O_3$) and silicon nitride ($Si_3N_4$) in one embodiment. Thereafter, the wafer including the temporary substrate 30, the first and second subcells 12 and 14, the gridded metal layer 18 and the anti-reflection coating 22 may be trimmed or cut to the desired size and shape as shown by operation 54 and the associated top view.

As shown by the parallel path of the flowchart of FIG. 2a, the third subcell 16 may also be fabricated, such as concurrent with or otherwise in parallel with the fabrication of the first and second subcells 12 and 14. In this regard, the third subcell 16 may be formed of silicon such that a silicon subcell is provided as shown in operation 56. As shown the plan view associated with operation 56, an n/p junction may also be formed within the silicon subcell 16, such as by diffusion or by epitaxial growth of n-type in the p-type substrate. In this regard, the silicon subcell 16 may include a p-region 16a and an n-region 16b, as shown in more detail in FIG. 4. Thereafter, a gridded metal layer 20 may be formed upon the silicon subcell 16, such as upon the n-region 16b of the silicon subcell. See operation 58 and the plan view associated therewith. The gridded metal layer 20 may be formed by various techniques, such as by thermal vapor deposition. In this regard, FIG. 5 provides a top view of the silicon subcell 16 depicting the gridded metal layer 20. As shown in FIG. 5, the gridded metal layer 20 may include a plurality of grids extending across a surface of the silicon subcell, such as across a surface of the n-region 16b of the silicon subcell. The grids may be spaced apart from one another and may be disposed in a parallel arrangement. The gridded metal layer 20 may also include a common electrode that interconnects each of the grids and is positioned, for example, along one edge of the silicon subcell. As shown in FIG. 5, an anti-reflection coating 24 may also be formed on the silicon subcell 16, such as by thermal vapor deposition. In this regard, the anti-reflection coating 24 may be formed upon the exposed portions of the silicon subcell 16 between the grids of the gridded metal layer 20. Additionally, the opposite surface of the silicon subcell 16, such as the surface of the p-region 16a of the silicon subcell, may be coated with a metal, such as Cu, Ag or Au, such as by thermal vapor deposition in a vacuum chamber.

The resulting the silicon subcell 16 may then be cut to the desired shape and size. See operation 60 and the associated plan view. Although the silicon subcell may have various shapes and sizes, the shape of the silicon subcell is generally similar to or the same as the shape of the wafer that comprises the first and second subcells 12 and 14 and the temporary substrate 30. However, the size of the silicon subcell 16 is generally somewhat larger, such as 5%-10% larger in surface area, than the size of the wafer that comprises the first and second subcells 12 and 14 and the temporary substrate 30.

As shown at operation 62 and the associated plan view of FIG. 2a, the wafer that comprises the combination of first and second subcells 12 and 14 and the temporary substrate 30 may then be inverted and bonded to the silicon subcell 16. In this regard, the wafer that comprises the combination of the first and second subcells 12 and 14 and the temporary substrate 30 may be bonded to the silicon subcell 16 such that the second subcell and, in particular, the p-region 14b of the second subcell faces the silicon substrate and, in particular, the n-region 16b of the silicon substrate. While the wafer that comprises the combination of the first and second subcells 12 and 14 and the temporary substrate 30 may be bonded to the silicon subcell 16 in various manners, metal-to-metal bonds may be formed between the respective gridded metal layers 18 and 20 on the second subcell and the silicon subcell, respectively.

Thereafter, the temporary substrate 30 may be removed, such as by chemical etching such that the first subcell 12 and, in particular, the n-region 12a of the first subcell may be exposed. See operation 64 and the associated plan view of FIG. 2b. An electrical contact may then be formed on the first subcell 12, such as on the n-region 12a of the first subcell. See operation 66 and the associated plan and top views. The electrical contact may be formed in accordance with various techniques, the electrical contact of one embodiment is formed by thermal vapor deposition. While various types and configurations of electrical contacts may be formed on the first subcell 12, the electrical contact may be a gridded metal layer 34 as shown in the top view associated with operation 66. In this regard, the gridded metal layer 34 may include a plurality of grids extending across the first subcell 12, such as in a generally parallel and spaced apart relationship. The gridded metal layer 34 of this embodiment may also include a common electrode that interconnects each of the grids and may extend along an edge of the first subcell 12. Additionally, an anti-reflection coating 36 may be formed by various techniques, such as by thermal vapor deposition, upon the exposed portions of the first subcell 12, such as those portions of the first subcell that are exposed between the grids of the gridded metal layer 34 in the embodiment of FIG. 2b.

The resulting IMM solar cell 10 may therefore receive solar energy and efficiently produce electrical energy in response thereto. Among other features, the first and second subcells 12 and 14 are spaced from the silicon subcell 16, such as by the metal-to-metal bonds therebetween which serve to electrically connect the various subcells. By being spaced apart, however, the impact of any CTE mismatch and/or lattice mismatch between the first and second subcells 12 and 14 and the silicon subcell 16 is reduced, if not eliminated, thereby improving the performance of the resulting IMM solar cell 10. Additionally, the silicon subcell 16 may serve not only as the third subcell of the IMM solar cell 10, but also as a carrier for protecting the IMM solar cell from breakage during manufacture and other handling of the IMM solar cell. The inclusion of a silicon subcell 16 within the IMM solar cell 10 may also be advantageous in that the silicon subcell may be thinned, such as to 2 to 5 mils, so as to reduce the profile and weight of the IMM solar cell. Additionally, the silicon subcell 16 may be relatively inexpensive in comparison with other subcells formed of different materials and the silicon subcell may provide improved radiation performance as a result of the relatively high radiation resistance of the silicon subcell.

The band gap of the silicon subcell 16 may be higher than the optimal band gap for capture of solar energy. For example, the band gap of the silicon subcell 16 may be about 1.12 eV in comparison to an optimal band gap of about 1.0 eV for the efficient capture of solar energy. As a result of the band gap of the silicon subcell 16 being greater than the optimal band gap, the silicon subcell may generate less current in response to exposure to the same amount of solar energy than a subcell having the optimal band gap. In order to compensate for the increased band gap and the reduced current generation, the silicon subcell 16 may be larger than the combination of the first and second subcells 12 and 14, such as in terms of the surface area of the respective subcells. See FIG. 1. By having an increased surface area, the silicon subcell 16 may receive more solar energy than the first and second subcells 12 and 14 which may, in turn, generate increased current within the silicon subcell. As such, the reduced current attributable to the greater band gap of the silicon substrate 16 may be offset by sizing the silicon substrate to have a larger surface area than the first and second subcells so as to receive more solar energy and, in turn, to generate more electrical current. While the silicon substrate 16 may be made larger than the combination of the first and second subcells 12 and 14 by various amounts, the surface area of the silicon subcell of one embodiment is about 5%-10% greater than the surface area of the first and second subcells. Accordingly, the IMM solar cell 10 of one embodiment may enjoy the advantages of a silicon subcell 16 that are described above, while effectively compensating for the reduced current generation attributable to the higher band gap of the silicon subcell.

Many modifications and other embodiments of the present disclosure set forth herein will come to mind to one skilled in the art to which these embodiments pertain having the benefit of the teachings presented in the foregoing descriptions and the associated drawings. Therefore, it is to be understood that the present disclosure is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method of fabricating an inverted metamorphic multijunction (IMM) solar cell comprising:
   forming a first subcell upon a temporary substrate;
   forming a second subcell upon the first subcell, the second subcell having a smaller bandgap than the first subcell;
   depositing an anti-reflection coating on the second subcell;
   bonding the second subcell to a silicon subcell such that the anti-reflection coating on the second subcell faces the silicon subcell; and
   removing the temporary substrate.

2. A method according to claim 1 further comprising:
   forming a first gridded metal layer on the second subcell, wherein the first gridded metal layer comprises a plurality of grids; and
   forming a second gridded metal layer on the silicon subcell, wherein the second gridded metal layer comprises a plurality of grids,
   wherein bonding the second subcell to the silicon subcell comprises establishing metal-to-metal bonds between the first and second gridded metal layers of the second subcell and the silicon subcell such that a plurality of spaces are defined between grids of the first and second gridded metal layers in order to space the second subcell and the silicon subcell apart from one another.

3. A method according to claim 2 wherein depositing the anti-reflection coating on the second subcell comprises depositing the anti-reflection coating on exposed portions of the second subcell between grids of the first gridded metal layer; and wherein the method further comprises depositing an anti-reflection coating on exposed portions of the silicon subcell between grids of the second gridded metal layer.

4. A method according to claim 1 further comprising forming an electrical contact on the first subcell following removal of the temporary substrate.

5. A method according to claim 4 further comprising depositing an anti-reflection coating on exposed portions of the first subcell.

6. A method according to claim 1 further comprising providing the silicon subcell having a larger area than the first and second subcells such that a peripheral portion of the silicon subcell extends beyond the first and second subcells.

7. A method according to claim 1 wherein forming the first subcell comprises forming an n/p junction within the first subcell, and wherein forming the second subcell comprises forming an n/p junction within the second subcell.

8. A method according to claim 1 further comprising forming an n/p junction within the silicon subcell prior to bonding the second subcell to the silicon subcell.

9. A method according to claim 1 further comprising thinning the silicon subcell to a thickness of 2 to 5 mils.

10. A method of fabricating an inverted metamorphic multijunction (IMM) solar cell comprising:
    forming a first subcell comprised of GaInP;
    forming a second subcell of $In_xGa_{1-x}As$ upon the first subcell, wherein $0 \leq x \leq 0.1$, and wherein the second subcell has a smaller bandgap than the first subcell;
    forming a first gridded metal layer on the second subcell, wherein the first gridded metal layer comprises a plurality of grids;
    providing a silicon subcell having a second gridded metal layer thereon, wherein the second gridded metal layer comprises a plurality of grids; and
    establishing metal-to-metal bonds between the first and second gridded metal layers of the second subcell and the silicon subcell such that a plurality of spaces are defined between grids of the first and second gridded metal layers in order to space the second subcell and the silicon subcell apart from one another.

11. A method according to claim 10 wherein forming the first subcell comprises forming the first subcell upon a temporary substrate of GaAs or Ge, and wherein the method further comprises removing the temporary substrate following establishment of the metal-to-metal bonds.

12. A method according to claim 10 further comprising depositing an anti-reflection coating on exposed portions of the second subcell between grids of the first gridded metal layer such that the anti-reflection coating on the second subcell faces the silicon subcell once the metal-to-metal bonds have been established between the first and second gridded metal layers of the second subcell and the silicon subcell.

13. A method according to claim 10 wherein providing the silicon substrate comprises forming the second gridded metal layer and depositing an anti-reflection coating on exposed portions of the silicon subcell between grids of the second gridded metal layer.

14. A method according to claim 10 further comprising forming an electrical contact on the first subcell following establishment of the metal-to-metal bonds.

15. A method according to claim 14 further comprising depositing an anti-reflection coating on exposed portions of the first subcell.

16. A method according to claim 10 wherein providing the silicon subcell comprises providing the silicon subcell having a larger area than the first and second subcells such that a peripheral portion of the silicon subcell extends beyond the first and second subcells.

17. A method according to claim 16 wherein providing the silicon subcell having a larger area than the first and second subcells comprises providing the silicon subcell to have an area that is 5% to 10% larger that the first and second subcells.

18. A method according to claim 10 wherein forming the first subcell comprises fanning an n/p junction within the first subcell, wherein forming the second subcell comprises forming an n/p junction within the second subcell, and wherein providing the silicon substrate comprises forming an n/p junction within the silicon subcell prior to establishment of the metal-to-metal bonds.

19. A method according to claim 9 further comprising thinning the silicon subcell to a thickness of 2 to 5 mils.

20. A method according to claim 10 further comprising establishing a tunnel junction from adjacent portions of the first and second subcells.

* * * * *

UNITED STATES PATENT AND TRADEMARK OFFICE
CERTIFICATE OF CORRECTION

Page 1 of 1

PATENT NO.        : 9,184,332 B2
APPLICATION NO.   : 13/176325
DATED             : November 10, 2015
INVENTOR(S)       : Ho It is certified that error appears in the above-identified patent and that said Letters Patent is hereby corrected as shown below:

In the claims:

Column 9,
Line 14, "fanning" should read --forming--;
Line 20, "claim 9" should read --claim 10--.

Signed and Sealed this
Third Day of May, 2016

Michelle K. Lee
*Director of the United States Patent and Trademark Office*